(12) United States Patent
Wang et al.

(10) Patent No.: US 6,594,809 B2
(45) Date of Patent: Jul. 15, 2003

(54) LOW LEAKAGE ANTENNA DIODE INSERTION FOR INTEGRATED CIRCUITS

(75) Inventors: Shao-Yu Wang, Hsin-Chu (TW); Wen-Hsiang Huang, Hsin-Chu (TW); Hsiao-Pin Su, Hsin-Chu (TW); Jun-Jyeh Hsiao, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 84 days.

(21) Appl. No.: 09/725,825

(22) Filed: Nov. 29, 2000

(65) Prior Publication Data

US 2002/0066067 A1 May 30, 2002

(51) Int. Cl.[7] .............................................. G06F 17/50
(52) U.S. Cl. .................. 716/10; 716/1; 716/8; 716/11; 716/12
(58) Field of Search .......................... 716/1–2, 4, 7–10, 716/11–15

(56) References Cited

U.S. PATENT DOCUMENTS

| | | | | |
|---|---|---|---|---|
| 5,901,065 A | * | 5/1999 | Guruswamy et al. | 716/10 |
| 5,966,517 A | * | 10/1999 | Cronin et al. | 716/1 |
| 5,984,510 A | * | 11/1999 | Guruswamy et al. | 716/2 |
| 6,308,308 B1 | * | 10/2001 | Cronin et al. | 716/4 |
| 6,389,584 B1 | * | 5/2002 | Kitahara | 716/11 |

* cited by examiner

Primary Examiner—Matthew Smith
Assistant Examiner—Paul Dinh
(74) Attorney, Agent, or Firm—Tung & Associates

(57) ABSTRACT

Antenna diodes used to correct antenna rule violations during the design and formation of integrated circuits are defined within filler cells laid out on the IC chip following the layout of standard electronic module cells and routing of electrical conductors on the chip. The filler cells are disposed in gaps between standard cells containing the electronic modules. The diodes are formed in unconnected pairs that are selectively connected to each other and to an adjacent conductor in order to correct antenna rule violations. Low current leakage is achieved as a result of the use of a fewer number of diode circuits, and the fact that they remain unconnected until used to correct an antenna rule violation.

9 Claims, 3 Drawing Sheets

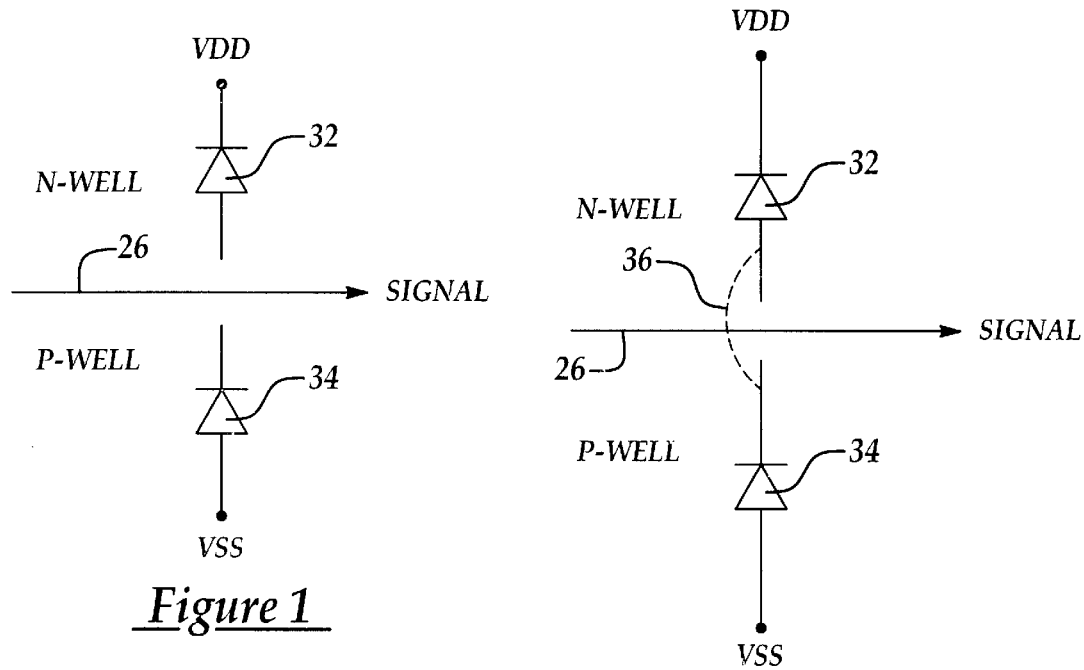
Figure 1
Figure 2
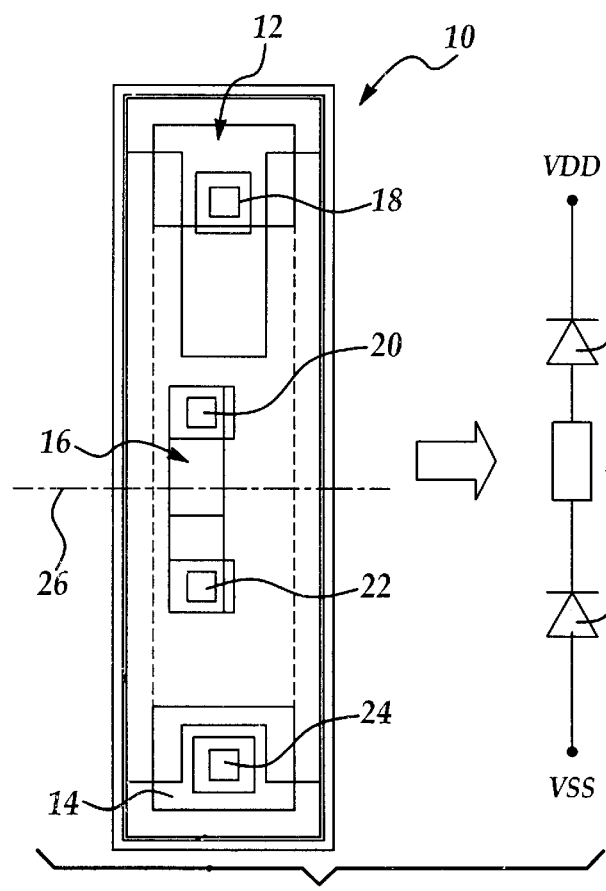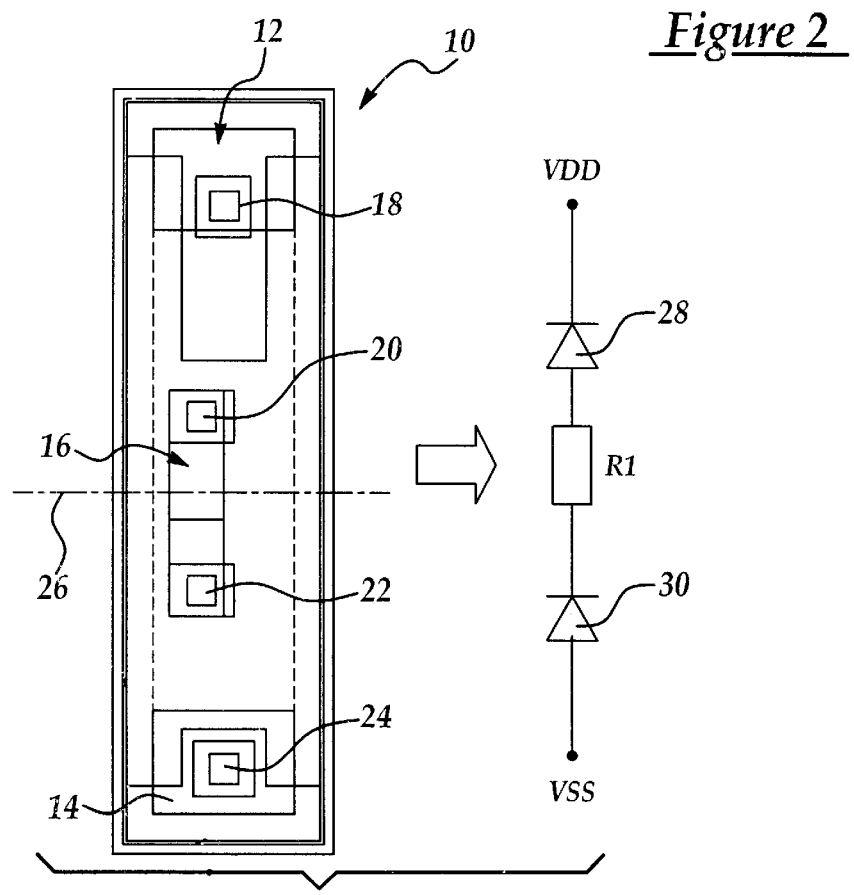
Figure 3
Prior Art

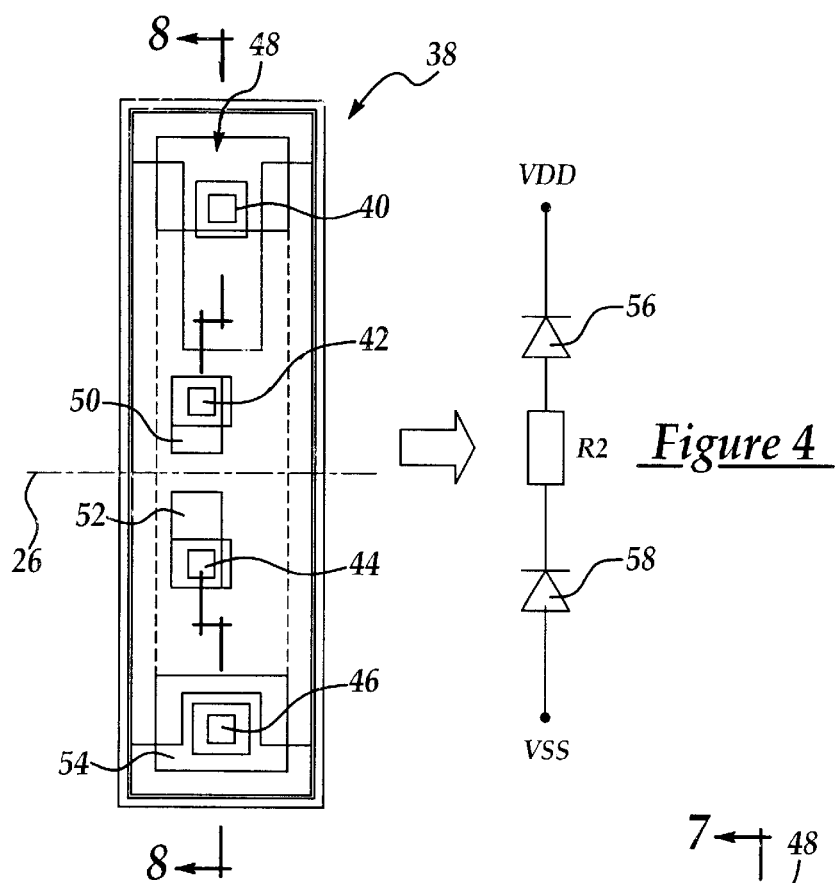
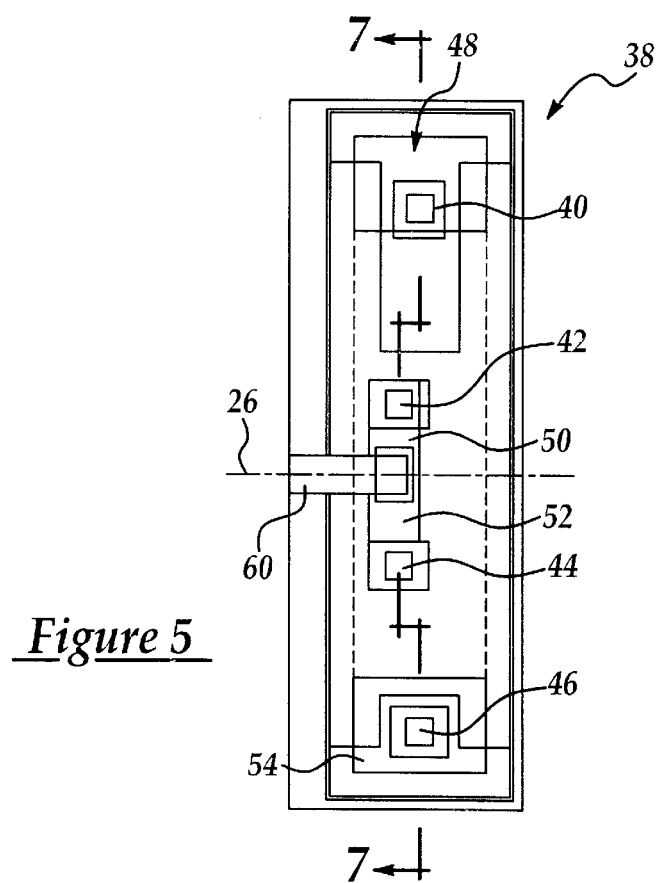

LOW LEAKAGE ANTENNA DIODE INSERTION FOR INTEGRATED CIRCUITS

TECHNICAL FIELD

The present invention broadly relates to the design, layout and fabrication of integrated circuits on a semiconductor chip, and deals more particularly with the insertion of antenna diodes in the integrated circuit in order to correct for antenna rule violations.

BACKGROUND OF THE INVENTION

Recent rapid advances in integrated circuit (IC) technology have created a number of challenges in the design, layout and fabrication of IC's at the chip level. The availability of sub 0.25 micron silicon technologies has permitted the fabrication of millions of logic gates on a single chip. Functions that were previously implemented across multiple chips are now being integrated onto a single chip. Circuit characteristics such as resistance and coupling capacitance, previously second order defects, are now first order defects in the environment of sub-quarter micron silicon technologies. At the same time, the increasingly competitive environment forces manufacturers to bring their chips to market in a shorter time interval. Often, the initial design, layout and mask fabrication can be very time consuming, even using electronic design automation (EDA) software. Even though the design process is highly automated, it is common to make manual changes to the final layout in order to achieve engineering change orders, foundry re-targeting and yield enhancement.

The design and layout of IC's consists of a number of steps that are performed in a pre-determined order. A general floor plan is first drawn up in which standard cells, taken from a library of cells, are laid out on the chip real estate. Each of these standard cells includes an electronic module or component. After the placement of the standard cells is determined, a routing step is performed in which electrical conductors are laid out or "routed" on the chip in order to interconnect the electronic modules with each other and with peripheral contact pads that are used to connect the IC with external circuitry. More specifically, during circuit layout synthesis, routing typically involves the connection of N-Type and P-Type transistors and signal input/output ports using electrical connections and applicable layers according to the electrical connectivity of the circuit being laid out. The applicable layers for interconnection usually include poly-silicon, diffusion and metal. Routing has a profound effect on the quality of the final compacted cell layout. Bad routing can lead to increased layout errors, poor electrical performance, and low yields.

Following the placement and routing, a series of design rule checks are performed to determine whether any of a number of known design rules have been violated by the final placement and routing. One of these design rules involves so-called "antenna rule violations". Antenna rule violations are related to a phenomena in which certain of the routed conductors act as antennas that attract and store an electrical charge that is developed during the manufacturing process, typically during plasma etching. Plasma etching is a technique widely used in the fabrication of integrated circuits, wherein reactive ions are generated in an ion discharge and accelerated by an electrical field. These ions collide with the wafer surface carrying the semiconductor device being fabricated. The glow discharge used in plasma etching typically results in electrically charging some regions over the wafer surface. This charging can occur in a conductive layer region, for example at the poly-silicon gate formed over the surface of the wafer. A conductor line connected to the gate can act as antenna to store a charge during the etching process, thereby amplifying the charging effect. The static charge stored in the conductors connected to the input gates of transistors can ultimately discharge to the gate inputs, thereby destroying the transistor as well as the IC during the fabrication process. In order to avoid possible damage to the input gates caused by electrostatic discharge due to the antenna effect, protective diodes are sometimes installed at the input gates of transistors. These diodes are referred to as "antenna diodes" since they provide a discharge path to ground for the charges stored in the offending conductors.

In order to "insert" antenna diodes in a circuit to correct an antenna rule violation, antenna diodes were defined in so-called standard cells forming part of a library of cells used by the IC designer to aid in speeding up the design and layout process. However, because antenna diodes were previously laid out along with the other standard cells, it was necessary to provide ample "real estate" on a chip to accommodate a sufficient number of antenna diodes so that when it came time to correct antenna rule violations, the designer was assured that an antenna diode would be in close proximity to the conductor giving rise to the violation.

In addition to the effective waste of space on the IC chip resulting from the provision of a more than necessary number of antenna diodes, the large number of antenna diodes present on the chip gave rise to leakage currents. Leakage currents occur as a result of the fact that although not physically connected to the conductors, the diodes themselves were connected to ground and were placed in close proximity to the conductors. Although the leakage current through these diodes was small, because of the large number of diodes present on a chip, the total amount of leakage was sufficient to adversely effect circuit timing performance.

It would therefore be desirable to provide antenna diode insertion that reduces the overall amount of chip area required to correct antenna rule violations, while also reducing the amount of leakage current resulting from the presence of antenna diodes. The present invention is directed towards satisfying this need.

SUMMARY OF THE INVENTION

According to one aspect of the invention, a method is provided for forming an integrated circuit on a chip, comprising the steps of laying out a plurality of electrical modules on the chip, wherein each of the modules is defined by a standard cell; establishing routing of conductors on a chip connecting the modules; laying out a plurality of filler cells on a chip; identifying antenna rule violations; and, correcting the antenna rule violations by selectively connecting the diode circuits with adjacent ones of conductors violating the antenna rules. The filler cells containing the antenna diodes are positioned in gaps lying between the standard cells. Each antenna diode circuit comprises a pair of diodes that are connected together in a circuit at the same time the antenna diode circuit is connected with a proximal conductor.

According to another aspect of the invention, an integrated circuit on a chip is provided, comprising a plurality of electrical modules defined in standard layout cells, wherein the standard cells are spaced apart to form gaps therebetween; a plurality of conductors on the chip forming electrical connections with the modules; a plurality of filler cells disposed within the gaps, certain of the filler cells containing an antenna diode circuit for discharging residual current present in an adjacent one of the conductors; and a plurality of electrically conductive links each connecting one of the conductors with one of the antenna diode circuits. Because the antenna diodes are formed in filler cells that ordinarily remain blank, the total area on the chip required for antenna diodes is substantially reduced. Since the diode in each diode circuit remains unconnected until the time of insertion, and the total number of antenna diodes is less than that previously required, the total amount of leakage current is reduced.

BRIEF DESCRIPTION OF THE DRAWINGS

In the drawings, which form an integral part of the specification, and are to be read in conjunction therewith, and in which like components are used to designate identical components in the various views:

FIG. 1 is a schematic diagram of an antenna diode according to the present invention before connection thereof with an associated conductor on an integrated circuit chip;

FIG. 2 is a view similar to FIG. 1 but showing the antenna diode having been connected to the conductor after a subsequent step in the design process;

FIG. 3 is a plan view of a standard cell containing an antenna diode according to the prior art;

FIG. 4 is a plan view of a filler cell containing an antenna diode according to the preferred embodiment of the present invention, but before the diode has been connected to a conductor;

FIG. 5 is a view similar to FIG. 4 but showing the antenna diode after connection thereof to the conductor in order to correct antenna diode rule violation;

DESCRIPTION OF THE PREFERRED EMBODIMENT

The present invention relates to an improved technique and related arrangement for the insertion of antenna diodes during the final steps of designing IC's that increases manufacturing yields and increases IC performance as a result of reduced leakage current through the diodes. Also significantly, the technique of the present invention substantially reduces the cycle time for designing ICs.

As previously explained, IC's are typically designed using a library of standard cells from which the IC designer selects desired cells and lays them out on an area representing the two-dimensional geometry of the IC chip. Each of the standard cells includes a common electronic component or module that comprises an active or passive component or network forming part of the IC. Also as part of the initial placement and layout of the IC, the designer inserts filler cells into gaps between the standard cells that are spaced apart on a chip. These filler cells are normally blank, i.e. they do not contain any active or passive components, and thus, in a sense, represent wasted space.

Figure 6:
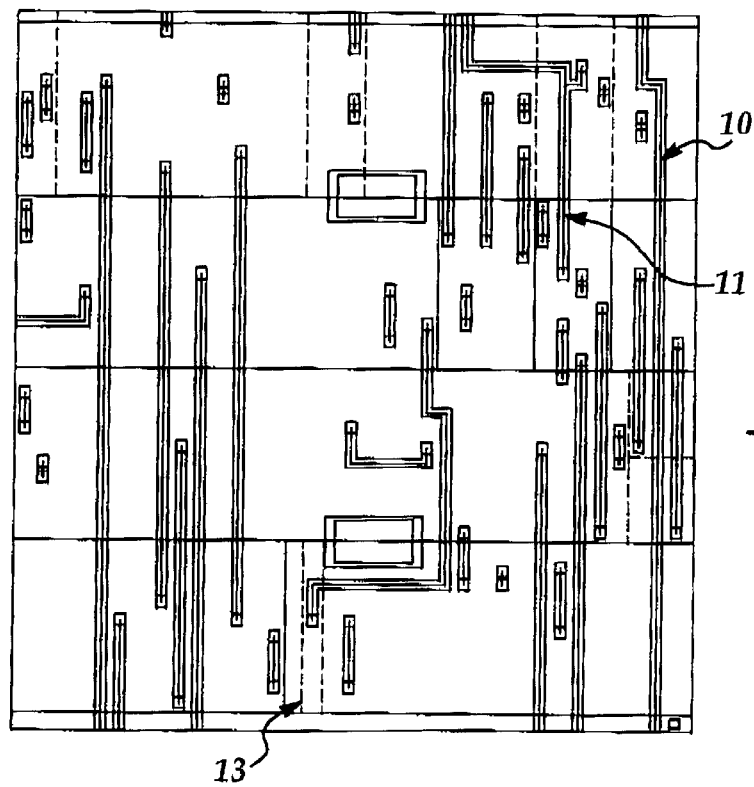
FIG. 6 is a plan view of an IC layout showing the relationship of the antenna diode, standard cells and fillers cells.

A typical IC layout is shown in FIG. 6, wherein there is shown a plurality of filler cells 13, a later discussed antenna diode cell 10 and routing 11 for the antenna diode cell 10.

After laying out and placing the standard and filler cells, conductors are laid out on the chip's face in a process referred to as "routing". Design software is normally used to effect automatic routing in order to form interconnections between the components and connection pads that permit connecting the IC to external circuitry. Even though routing is automatically formed, errors can be made that result in the violation of a series of standard design rules. Thus, following the routing step, a series of rule violation checks are performed to identify all layout problems, following which appropriate corrections are made to the layout. As previously discussed, one of these design rules is the so-called antenna rule violation wherein routed conductors may act as antenna to store potentially damaging electrical charges. In order to correct an antenna rule violation the designer simply interconnects an antenna diode to the offending conductor in order to permit the safe discharge of the stored electrical charge. In the past, antenna diodes were provided in the form of a standard cell forming part of the cell library. Antenna diode cells were laid out during the initial placement process, and in sufficient number to assure that all conductors were in proximity to an antenna diode cell in order that the diode could be connected to the conductor if an antenna rule violation later became apparent after the design rule check had been performed. One such antenna diode circuit forming part of a standard cell 10 is shown in FIG. 3 along with an equivalent schematic circuit. The standard diode circuit cell 10 includes a pair of diodes 28, 30 connected in series between a voltage source VSS and voltage drain VDD. Diode 28 is formed by an N-well defined in a P-type substrate, thus defining a P-N junction. Diode 28 is connected via a port 18 to a metal pad 12. Diode 30 is formed by a P-well in an N-type substrate and is connected via a port 22. Diodes 28, 30 are connected in series by a metal link 16. Resistance R1 represents the resistance of the diode circuit. In order to connect the diode circuit to the conductor 26, a metal layer is formed over the conductor 26 and the link 16 during the manufacturing process.

Referring now to FIGS. 1, 2 and 4, the present invention comprises a diode circuit defined by a filler cell 38. The diode circuit includes a pair of reverse biased junction diodes 56, 58 connected in a series circuit and having an internal resistance R2 before the diode circuit is connected with a conductor 26 to correct an antenna rule violation. Diode 56 comprises an N-well defined within a P-type material and is connected via port 40 to a metalized pad 48. Similarly, diode 58 is formed by a P-well defined in an N-type material and is connected via a port 46 to a second metal pad 54. Diodes 56, 58 are respectively connected via ports 42, 44 to a pair of metal connecting pads 50, 52 which are exposed on opposite sides of, but un-connected to the conductor 26. Thus, as seen in FIG. 1, prior to connection of the diode circuit with the conductor 26, diodes 56, 58 are un-connected with each other and with the conductor 26. Since the series circuit containing the diodes 56, 58 have not yet been formed, the possibility does not exist for any significant leakage current to flow through the diode circuit.

Figure 7:
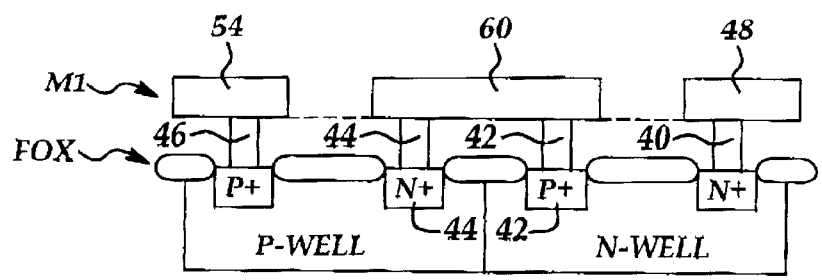
FIG. 7 is a sectional view taken along the line 7—7 in FIG. 5.
Figure 8:
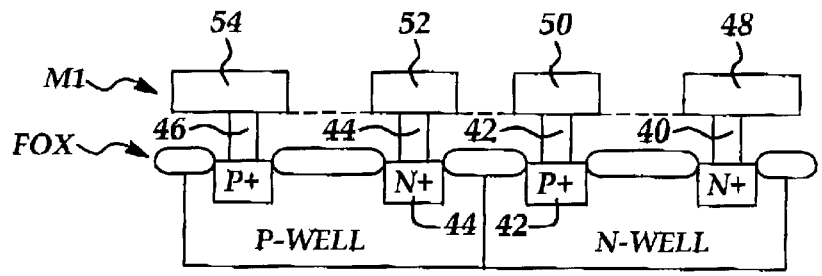
FIG. 8 is a sectional view taken along the line 8—8 in FIG. 4.

Referring now also to FIGS. 5, 7 and 8, when it is desired to connect the diode circuit shown in FIG. 4 to the conductor 26 in order to correct an antenna rule violation, a conductive link 60 is formed which overlies conductor 26 as well as portions of both the metal pads 50, 52. Consequently metal link 60 not only connects the diode circuit with the conductor 26, but also completes the series circuit connecting diodes 56, 58 together. The connecting link 60 is formed as part of the routing process to correct antenna rule violations associated with the original circuit design or as a result of later changes in the circuit that create rule violations. Once the connecting link 60 couples the conductor 26 with the diode circuit, a discharge path is formed to allow any stored charge in the conductor to be drained off through the diode circuit, thereby assuring that the input gates of transistors coupled with conductor 26 are not damaged by the stored charge.

Since the diode circuit of the present invention is formed in a filler cell 38, rather than in a standard cell 10, a fewer number of the diode circuits are necessary since they can be strategically placed in the circuit layout after the standard cells have been placed. Consequently the total amount of leakage current resulting from the antenna diodes is considerably less than that which would occur if the diodes were laid out as standard cells.

It is thus apparent that a method is provided for forming an IC on a chip that comprises the steps of: laying out electrical modules on the chip when at least certain of the modules are defined by standard layout cells forming a library of the cells; establishing the routing of conductors on the chip that interconnect the modules; laying out a plurality of filler cells on the chip wherein at least some of the filler cells include the diode circuit for discharging residual electrical charge present in an adjacent ones of the conductors and constituting an antenna rule violation; identifying antenna rule violations based on the routing of the conductors previously performed; and, correcting the antenna rule violations by selectively connecting the diode circuits with adjacent ones that the conductors violating the antenna rules.

From the foregoing, it is apparent that the antenna diode insertion method and related IC described above not only provide for the reliable accomplishment of the objects of but it do so in a particularly economical and efficient manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A method of forming an integrated circuit on a chip, comprising the steps of:

(A) laying out a plurality of electrical modules on said chip, at least certain of said modules being defined by standard layout cells forming part of a library of said cells;

(B) establishing the routing of conductors on said chip connecting said modules;

(C) laying out a plurality of filler cells on said chip, at least certain of said cells containing a diode circuit for discharging a residual electrical charge present in an adjacent one of said conductors and constituting an antenna rule violation, each of said diode circuits comprising two diodes unconnected to each other;

(D) identifying antenna rule violations based on routing of the conductors performed in step (B); and (E) correcting said antenna rule violations by selectively connecting said diodes in the diode circuits laid out as filler cells in step (C) with each other and with adjacent ones of said conductors violating said antenna rules.

2. The method of claim 1, wherein step (A) is performed by placing said filler cells in field areas on said chip, between said conductors and said standard cells.

3. The method of claim 1, wherein step (E) is performed by depositing a layer of conductive metal over at least portions of the filler cells containing the selectively connected diode circuits.

4. The method of claim 1, wherein said pairs of diodes are connecting by depositing a layer of conductive material over at least a portion of said diode circuit.

5. The method of claim 1, wherein step (C) is performed after completing steps (A) and (B).

6. The method of claim 1, wherein step (C) is performed by placing said filler cells in gaps lying between said standard cells.

7. The method of claim 1, including the step of connecting first and second diodes together in each of the diode circuits connected in step (E).

8. The method of claim 7, wherein the step of connecting the first and second diodes together is performed simultaneously with step (E).

9. An integrated circuit formed on a semiconductor chip, comprising:

a plurality of electrical modules on said chip, at least certain of said modules being defined by standard layout cells forming part of a library of said cells, at least certain of said standard cells being spaced apart to form gaps therebetween;

a plurality of conductors on said chip forming electrical connections with said modules;

a plurality of filler cells disposed respectively within said gaps, at least certain of said filler cells including a diode circuit for discharging a residual electrical current present in an adjacent one of said conductors, each of said diode circuits comprising two diodes unconnected to each other; and a plurality of electrically conductive links, each to connect diodes of one of said diode circuits with the adjacent one of said conductors.

* * * * *